United States Patent [19]

Gurtler et al.

[11] 4,410,471
[45] Oct. 18, 1983

[54] RIBBON-TO-RIBBON CONVERSION WITH SHAPED MOLTEN ZONE

[75] Inventors: Richard W. Gurtler, Mesa; I. Arnold Lesk, Phoenix, both of Ariz.

[73] Assignee: Motorola, Inc., Schaumburg, Ill.

[21] Appl. No.: 323,797

[22] Filed: Nov. 23, 1981

[51] Int. Cl.$^3$ .............................................. B23K 28/00
[52] U.S. Cl. ...................................... 264/25; 264/332; 264/345
[58] Field of Search .................. 264/25, 332, 345; 156/617 R

[56] References Cited

U.S. PATENT DOCUMENTS

| | | | |
|---|---|---|---|
| 3,869,232 | 3/1975 | Ruus | 264/25 |
| 3,944,640 | 3/1976 | Haggerty | 264/25 |
| 4,058,699 | 11/1977 | Van Vloten | 264/25 |

OTHER PUBLICATIONS

Bleil, "A New Method for Growing Crystal Ribbons", *J. of Crystal Growth*, 5, (1969), 99–104.

Primary Examiner—John A. Parrish
Attorney, Agent, or Firm—John A. Fisher

[57] ABSTRACT

A method is provided for converting polycrystalline ribbon to macrocrystalline ribbon in which a molten zone is formed in and moved along the polycrystalline ribbon. Macrocrystalline material in ribbon shape is formed as the molten region passes and the molten material resolidifies. The molten zone is formed in the polycrystalline ribbon by impinging energy beams from two energy sources on the two major surfaces of the ribbon. The combined energy from the first and second energy sources is sufficient to melt the ribbon material and to form a molten zone extending through the thickness of the ribbon. The molten zone has an intersection with each of the major surfaces of the ribbon. The two energy sources are adjusted independently to control the area of the intersection of the molten zone with each surface so that the areas are non-identical.

6 Claims, 10 Drawing Figures

RIBBON-TO-RIBBON CONVERSION WITH SHAPED MOLTEN ZONE

BACKGROUND OF THE INVENTION

This invention relates to a method for converting polycrystalline material to macrocrystalline material in ribbon form and more particularly to a method for ribbon-to-ribbon conversion utilizing a shaped molten zone.

In the manufacture of semiconductor devices such as transistors, diodes, integrated circuits, photovoltaic cells, and the like, the semiconductor industry uses large quantities of semiconductor material in the form of thin wafers or sheets. It has been conventional to produce these semiconductor sheets by first growing a single crystal semiconductor ingot, sawing the ingot into a plurality of thin sheets, and then lapping and polishing the sheets to the desired thickness and surface finish. While this process has proved satisfactory for most semiconductor devices, it is too expensive for some large area semiconductor devices, and especially for large area photovoltaic devices or solar cells. In fact, in order that photovoltaic devices become a viable alternate energy source, a significant reduction in the cost of the semiconductor starting material is essential.

Other techniques have been developed for the production of thin sheets of semiconductor material suitable for the production of solar cells. One of these is the so called ribbon-to-ribbon (RTR) conversion process which is expected to yield high quality substrates for use in solar cell fabrication as well as for use in the production of a variety of other semiconductor products. The RTR process uses a scanned beam of energy impinging on a polycrystalline ribbon to locally melt the ribbon and to induce crystal growth as the ribbon is translated past the energy beam. Thus a polycrystalline ribbon is transformed into a macrocrystalline ribbon by the process of localized melting and then recrystallization. A macrocrystalline structure is one in which the crystals are of sufficiently large size to permit efficient semiconductor action; a monocrystalline ribbon wherein the ribbon is but a single crystalline body is therefore encompassed within the term macrocrystalline. In this context, the word "ribbon" implies a strip having a width much greater than its thickness. Typical dimensions might be a length of up to several meters, a width of ten to one hundred millimeters, and a thickness of fifty to two hundred and fifty micrometers.

Although the RTR process has proved to be viable for the production of macrocrystalline substrates, the process heretofore practiced has not been capable of sufficiently rapid conversion to take full advantage of its economic potentiality. The limited conversion velocity results from difficulties with controlling the amount of molten material, removing the heat of fusion from the growing interface, and establishing the correct temperature profile in the cooling region to limit stress generation during cooldown.

Accordingly, a need existed for a method which would allow the ribbon-to-ribbon process to proceed at a more rapid rate than heretofore possible and would therefore make the RTR process economically feasible.

It is therefore an object of this invention to provide an improved process for the ribbon-to-ribbon conversion of polycrystalline material to macrocrystalline material.

It is a further object of this invention to provide an improved ribbon-to-ribbon process which improves the thermal gradient along the ribbon and reduces stress in the converted ribbon.

SUMMARY OF THE INVENTION

The foregoing and other objects are achieved in the present invention through the use of a shaped molten zone. One or more energy sources such as lasers or electron beam sources are focussed on the surface of a ribbon of polycrystalline material. The energy from the source or sources is sufficient to melt the material, forming a molten zone which extends through the thickness of the ribbon. In accordance with the invention the impinging energy is controlled so that the intersections of the molten zone with the first and second surfaces of the ribbon are asymmetrical. More specifically, in one embodiment of the invention, the impinging energy is controlled to obtain a molten zone whose intersection with a first surface of the ribbon is narrow in the direction along the ribbon and whose intersection with the second surface is wide so that the molten zone, in cross-section, is more or less wedge shaped.

DETAILED DESCRIPTION OF THE PREFERRED EMBODIMENTS

Figure 1:
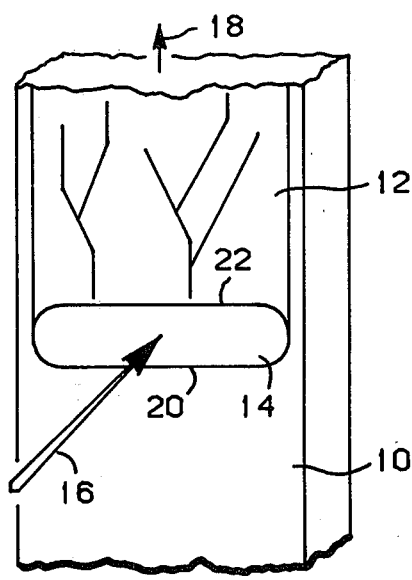
FIG. 1 illustrates the prior art ribbon-to-ribbon conversion process.

FIG. 1 illustrates the ribbon-to-ribbon (RTR) process as previously practiced in which a polycrystalline ribbon 10 is converted to a macrocrystalline ribbon 12. A molten zone 14 extending through the thickness of the ribbon is formed by a beam of energy 16 which impinges on the ribbon and is scanned across its width. The ribbon moves vertically past energy source 16 in the direction indicated by arrow 18. As the ribbon moves past the energy source, melting occurs at the lower edge 20 of the molten zone and resolidification with enhanced grain size occurs at the upper side of the molten zone 22. With rigid edge RTR as illustrated, there is, of course, only a single (complex-shaped) solid-liquid surface. The leading edge of this surface is herein referred to as a melting boundary while the trailing edge is referred to as a growth boundary or freezing boundary.

A number of interrelated factors limit the rate at which polycrystalline material can be converted to macrocrystalline material in the prior art RTR process. The molten silicon material is maintained in place during the melting process by surface tension forces between the molten material and the adjacent solid material. If the amount of molten material is excessive, however, surface tension is not able to contain the melt against the force of gravity and the melt spills. Molten zone 14 must therefore be of limited extent; this in turn limits the means for removing heat at the growth boundary 22. In order to remove the heat of fusion from the growth boundary this heat must travel along the macrocrystalline ribbon a considerable distance before a radiating surface of sufficiently large size is established. In addition, a particular quasi-linear temperature profile cooling region must be established in the macrocrystalline ribbon to limit stress generation during the cool down which would crack the ribbon. The limited means for removing the heat of fusion accompanied by the need for the cooling profile limit the allowable conversion speed.

Figures 2, 3, 4:
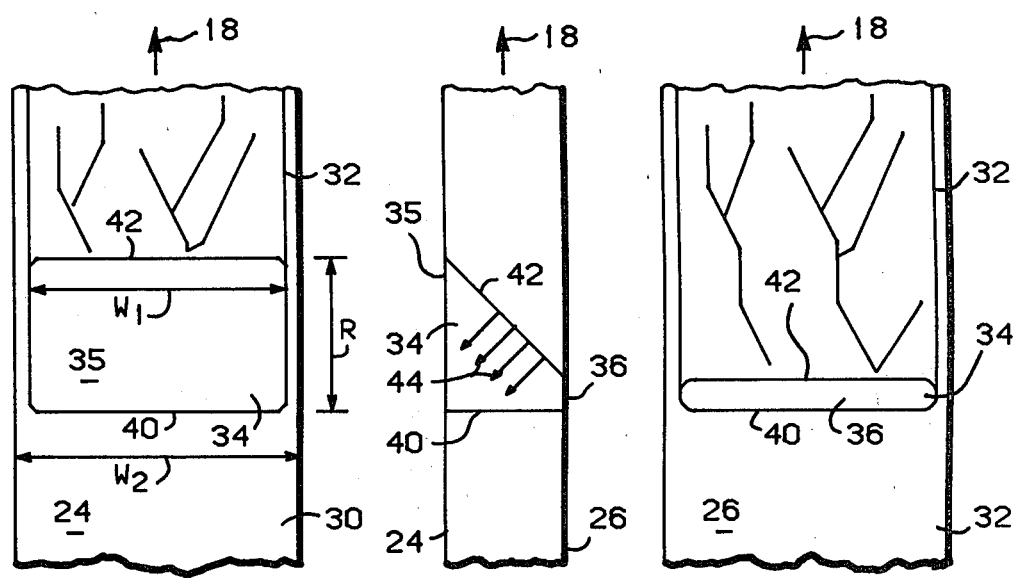
FIGS. 2–4 illustrate front, side, and rear views of one embodiment of the ribbon-to-ribbon process in accordance with the invention.

FIGS. 2-4 illustrate one embodiment of the invention whereby the above-noted difficulties are overcome allowing the conversion of polycrystalline ribbon to macrocrystalline ribbon to proceed at a higher rate. FIG. 2 illustrates the front surface 24 of the ribbon as a polycrystalline ribbon 30 is converted to macrocrystalline ribbon 32. FIG. 3 illustrates a cross-section perpendicular to the view shown in FIG. 2. FIG. 4 is a view illustrating the back surface 26 of the ribbon during the conversion process.

In accordance with one embodiment of the invention, intersection 35 of molten zone 34 with front surface 24 is an enlarged region shown here to be nearly rectangular. The intersection 36 of the molten zone with back surface 26 is of much smaller areal extent so that in cross-section molten zone 34 is generally wedge-shaped.

As the ribbon is moved in the direction shown generally by the arrow 18, melting of the polycrystalline ribbon occurs at leading boundary 40 of molten zone 34. Resolidification of the material in the molten zone takes place by refreezing at growth boundary 42. The crystal growth direction, normal to growth boundary 42, is shown by arrows 44. It is also possible, of course, to hold the ribbon stationary and move the energy source relative to the ribbon.

By using a wedge-shaped molten region the growth boundary is greatly enlarged. The crystal growth rate, occurring normal to the boundary, is very much less than the ribbon pull rate; this permits a faster ribbon conversion rate. Also, there is now a large surface area with width effectively between $W_1$ and $W_2$ and height R as illustrated in FIG. 2 which is very close in temperature to the melting point of the semiconductor material and which serves as an effective radiating surface for the removal of the heat of fusion of the growing interface. The resulting enhancement of the heat removal contributes to the increased allowable rate of ribbon conversion.

Figure 5:
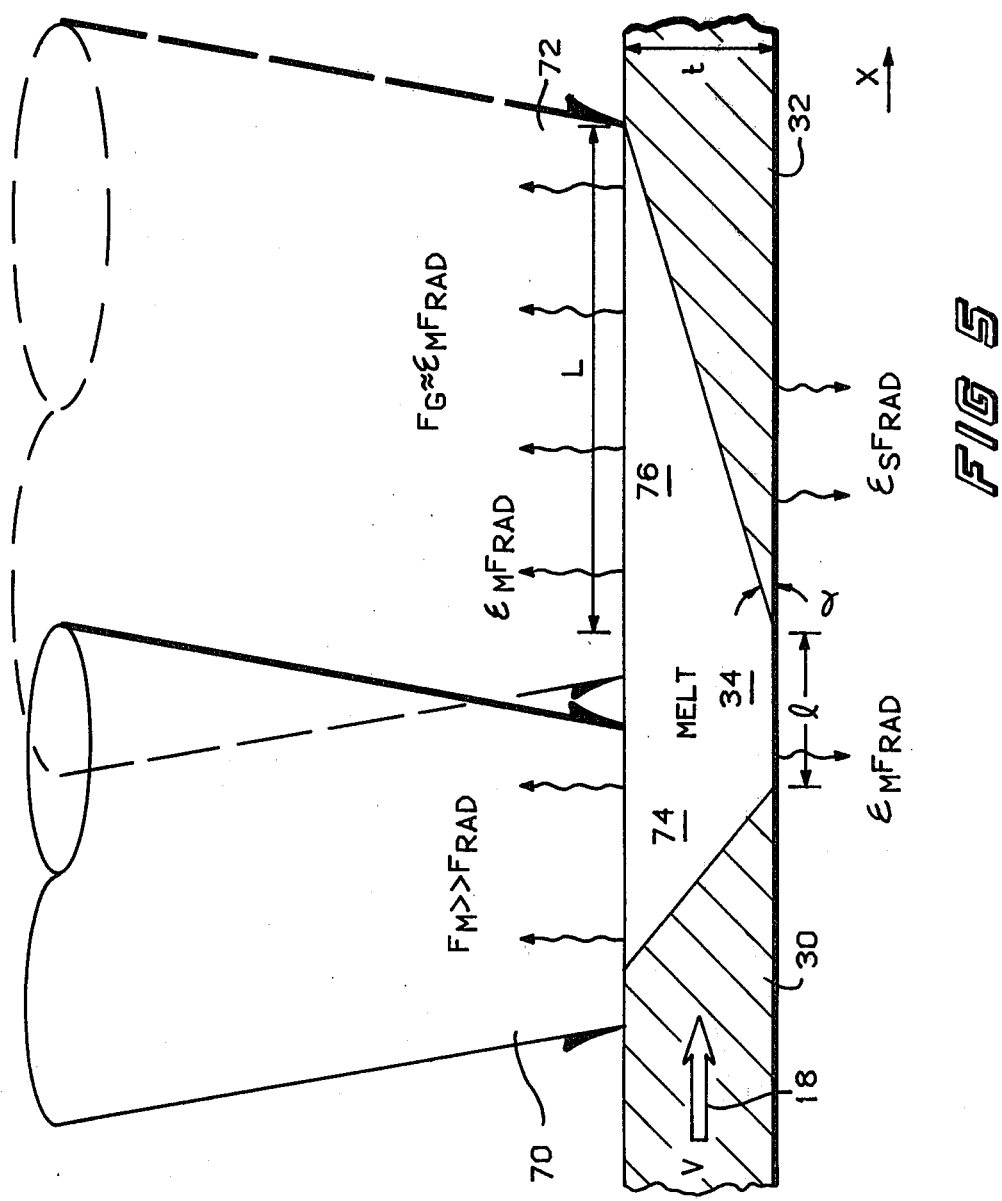
FIGS. 5–7 illustrate means for achieving the improved RTR process.

FIG. 5 illustrates more specifically, in a non-limiting example, one method for achieving asymmetrical conversion in accordance with the invention. Polycrystalline ribbon 30 and macrocrystalline ribbon 32 are again illustrated in cross-section. Two distinct impinging energy beams 70, 72 are used which provide power densities $F_M$ and $F_G$ in the "melting" region 74 and "growth" region 76, respectively, of the liquid 34. Radiation from the surfaces is governed by the blackbody radiation law. The amount of radiation emitted by a perfect blackbody at the melting point of silicon is about 44 W/cm²; real surfaces radiate proportionately to this maximum amount, the proportionality constant being given by the emissivity $\epsilon$ of the surface. Thus, $\epsilon_M R_{RAD}$ is the radiated flux from the melt surface, and $\epsilon_S F_{RAD}$ is the radiation flux from the solid surface where $\epsilon_M$ is about 0.25 and $\epsilon_S$ is about 0.6.

The ribbon is melted through quite rapidly as it reaches the melting beam 70 which is adjusted so that $F_M>>F_{RAD}$, and then resolidifies more slowly as it passes through the growth region. The solidification rate is determined by the rate of heat removal from the liquid. Heat removal from the liquid-solid interface takes place by means of conduction through the solid and liquid regions to the surfaces. In this example, $F_G$ is adjusted to exactly balance $\epsilon_M R_{RAD}$. There is thus no net heat removal from the liquid surface in the growth region; all of the heat is removed from the solid, freely radiating surface. Under these conditions, a heat balance consideration at the solidifying interface gives $$v \sin \alpha H = \epsilon_S F_{RAD} \cos \alpha \text{ or}$$

$$v = (\epsilon_S F_{RAD}/H) \cot \alpha$$

where H is the latent heat of fusion per unit volume, $\alpha$ is the solidification angle defined by the $\tan \alpha = t/L$, and v is the velocity of the ribbon moving past the energy sources. The ribbon thickness is given by t and L is the projection of the growth interface on the ribbon surface. By controlling $F_G$, L and $F_M$, l, $\alpha$ and v are determined, in part according to the above relation. Here l is length of the intersection of the melt along the radiating surface.

For $\epsilon_S \sim 0.6$, $F_{RAD} \sim 44$ W/cm² and $H \sim 4215$ J/cm³, $$v = 0.376 \cot \alpha (\text{cm/min}).$$

For velocity and thickness of the ribbon v=10 cm/min and l=150 μm, respectively, it is required that $\alpha = 2.15°$ and L=4 mm.

An additional benefit of this asymmetrical mode of conversion is the greatly reduced maximum thermal gradient along the ribbon which is consistent with the conditions illustrated in FIG. 5. The maximum gradient in temperature, T, along the ribbon (the x-direction) is given by $$\partial_x T = -(\epsilon_S F_{RAD}/K) \tan \alpha.$$

Assuming K, the coefficient of thermal conductivity, is about 0.23 W/cm°K., and with the above value of $\alpha = 2.15°$, the thermal gradient $\partial_x T \gtrsim -4°$ C./cm. This is an extremely small gradient compared to that required by the prior art symmetrical conversion mode where the velocity is determined by conduction into the length of the ribbon, giving the following relationship between growth velocity and thermal gradient:

$$\partial_x T = -(vH/K).$$

For a conversion velocity v=1 cm/min, the thermal gradient must be greater than about 18,000° C./cm. While this is, of course, only the initial gradient which is modified rapidly as heat is allowed to travel to the ribbon surface to be radiated, it does indicate that very large gradients are necessary for this mode of conversion. Accordingly, symmetrical mode conversion rates are limited.

While FIG. 5 illustrates practice of the invention using two separate energy sources, it is not necessary that two such sources be used. In a preferred embodiment only a single energy source is used and the beam from that source is scanned and modulated to produce the appropriate energy fluxes.

Figure 6:
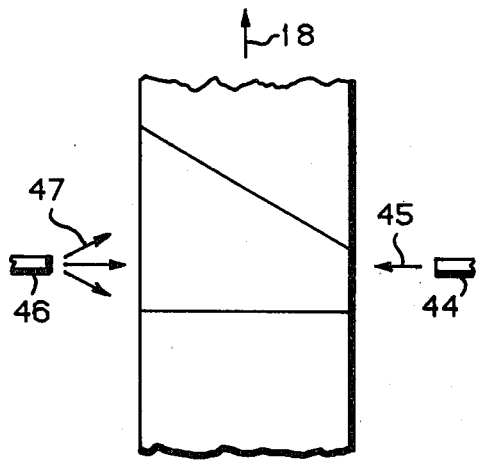

FIG. 6 illustrates schematically another means by which the molten zone having a particularly shaped cross-section can be achieved. The ribbon is supported in an apparatus (not shown) for conducting the ribbon-to-ribbon conversion. First 44 and second 46 energy sources are provided for heating the ribbon and forming the molten zone. The energy sources 44, 46 can be, for example, swept lasers or electron beams. The energy sources emit energy shown schematically at 45 and 47 which impinge upon the front and back surfaces, respectively, of the ribbon, By controlling this energy from the source, and by controlling the sweep pattern of either the laser or the electron beam, the shape and size of the intersection of the molten zone with the major surfaces of the ribbon is determined. Each source is adjusted so that the summation of the flux from the two sources approximates the conditions set forth above in connection with FIG. 5.

Because of the controllability of the electron beam, an electron beam source is particularly adaptable for this application. Besides providing the energy for melting the semiconductor material and forming the molten zone itself, an energy beam can be programmed to scan along the macrocrystalline ribbon at a prescribed duty cycle to further provide the desired heating profile along the ribbon to reduce stress and to prevent breakage in the resolidified material.

Figure 7:
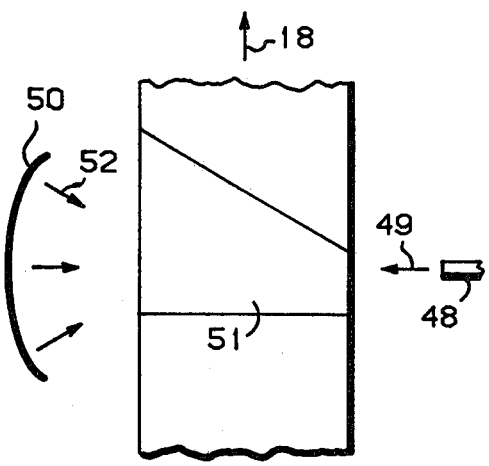

FIG. 7 illustrates alternate means for implementing the shaped melt zone process. In this embodiment a single energy source is used to impinge on the ribbon structure. A mirror 50 is placed in proximity to the rear surface of the ribbon structure and reflects energy which would otherwise be radiated away from the molten zone 51. The energy 52 reflected from the mirror impinges upon the side of the ribbon opposite the energy source 48 and effectively replaces the second discrete energy source.

Figure 8:
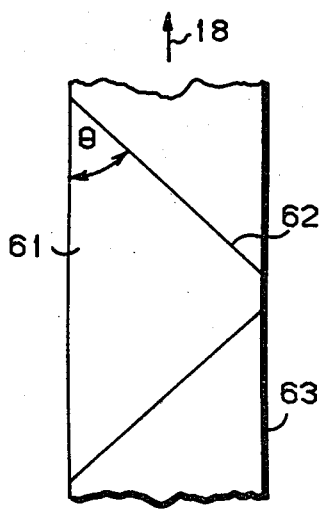
FIGS. 8–10 illustrate further shaped molten zones in accordance with the invention.
Figure 9:
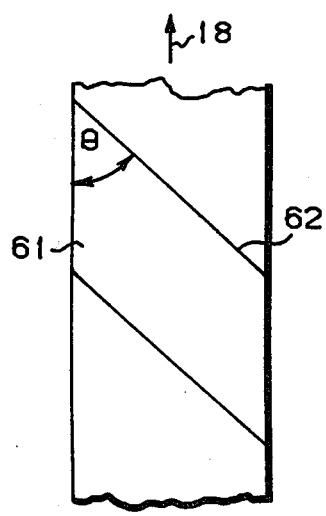
Figure 10:
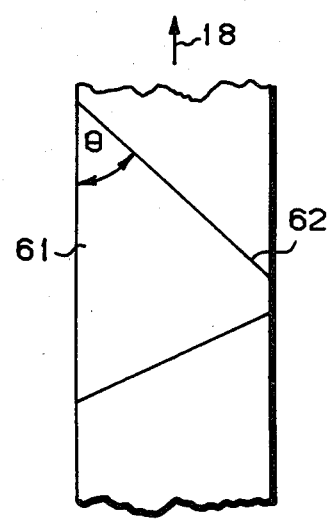

FIGS. 8–10 illustrate further shapes which the molten zone can assume in accordance with the invention. In each example the direction of ribbon movement is given by the arrow 18 and the freezing boundary 62 forms an acute angle, $\theta$, with the front surface 63 of the ribbon. The freezing boundary is enlarged in comparison to the freezing boundary of the prior art process. The shaped molten zone 61 is formed, for example, by two energy sources impinging upon the ribbon as illustrated in FIG. 6.

Thus, there has been provided in accordance with the invention an enhanced speed ribbon-to-ribbon conversion process which achieves the objects and advantages set forth above. The process including a shaped molten zone has been described in conjunction with specific embodiments thereof, but it is not intended that the invention or its usage be so limited. The process, for example, can be used for the ribbon-to-ribbon conversion of a wide variety of crystalline materials. Other variations and modifications will, of course, be apparent to those skilled in the art in light of the foregoing description. Accordingly, it is intended to embrace all such variations and modifications all fall within the scope of the invention.

We claim:

1. In a method for converting a polycrystalline ribbon having first and second major surfaces to a macrocrystalline ribbon wherein energy impinging on said polycrystalline ribbon forms a molten zone therein extending through the thickness of said ribbon and intersecting said first and second major surfaces, and said ribbon is in motion relative to said impinging energy causing said molten zone to move along said ribbon, said macrocrystalline material forming as said molten zone passes and the material therein resolidifies, the improvement which comprises: supplying said impinging energy from first and second sources impinging on said first and second major surfaces respectively; adjusting said first source to control the shape of said molten zone at said first major surface to have a first length along said ribbon at said first surface; and adjusting said second source to control the shape of said molten zone at said second major surface to have a second length along said ribbon, greater than said first length, at said second surface.

2. The method of claim 1 wherein said first and second sources comprise lasers.

3. The method of claim 1 wherein said first and second sources comprise electron beam sources.

4. The method of claim 1 wherein said first and second sources comprise a laser and an energy reflecting mirror.

5. In a method for converting a polycrystalline ribbon having first and second major surfaces to a macrocrystalline ribbon wherein energy impinging on said polycrystalline ribbon forms a molten zone therein extending through the thickness of said ribbon and intersecting said first and second major surfaces, and said ribbon is in motion relative to said impinging energy causing said molten zone to move along said ribbon, said macrocrystalline material forming as said molten zone passes and the material therein resolidifies, the improvement which comprises: supplying said impinging energy from first and second sources impinging on said first and second major surfaces respectively; adjusting said first source to control the shape of said molten zone at said first major surface; and adjusting said second source to control the shape of said molten zone at said second major surface, said adjusting said first and second sources comprising adjusting so that said molten zone intersects said first surface at a position along said ribbon displaced from the position said molten zone intersects said second surface.

6. In a method for converting a polycrystalline ribbon to a macrocrystalline ribbon each having first and second major surfaces wherein energy impinging on said polycrystalline ribbon forms a molten zone therein extending through the thickness of said ribbon and intersecting said first and second major surfaces and wherein said polycrystalline ribbon and said impinging energy are in relative motion causing said molten zone to move along said polycrystalline ribbon with said macrocrystalline ribbon forming as said molten zone passes said impinging energy and the material in said molten zone resolidifies, the improvement which comprises: adjusting said impinging energy to asymmetrically shape said molten zone to have a first surface area with said first major surface and a second surface area different from said first surface area with said second major surface.

* * * * *